United States Patent
Schmidt et al.

(10) Patent No.: US 7,675,049 B2
(45) Date of Patent: Mar. 9, 2010

(54) SPUTTERING COATING OF PROTECTIVE LAYER FOR CHARGED PARTICLE BEAM PROCESSING

(75) Inventors: Michael Schmidt, Gresham, OR (US); Jeff Blackwood, Portland, OR (US)

(73) Assignee: FEI Company, Hillsboro, OR (US)

( * ) Notice: Subject to any disclaimer, the term of this patent is extended or adjusted under 35 U.S.C. 154(b) by 387 days.

(21) Appl. No.: 11/706,053

(22) Filed: Feb. 14, 2007

(65) Prior Publication Data
US 2008/0073587 A1 Mar. 27, 2008

Related U.S. Application Data (60) Provisional application No. 60/773,396, filed on Feb. 15, 2006.

(51) Int. Cl.
*H01J 37/26* (2006.01)
*G21K 5/04* (2006.01)

(52) U.S. Cl. ............... 250/492.21; 250/306; 250/307; 250/310; 250/311; 250/492.1; 250/492.2; 250/492.3; 430/296; 430/297; 430/298

(58) Field of Classification Search ............ 250/306, 250/307, 309, 310, 311, 492.1, 492.2, 492.21, 250/492.3, 492.22; 430/296, 297, 298, 299
See application file for complete search history.

(56) References Cited

U.S. PATENT DOCUMENTS

| | | | |
|---|---|---|---|
| 4,639,301 A * | 1/1987 | Doherty et al. | ........... 250/251 |
| 5,188,705 A | 2/1993 | Swanson et al. | |
| 5,435,850 A | 7/1995 | Rasmussen | |
| 5,574,280 A | 11/1996 | Fujii et al. | |
| 5,639,699 A | 6/1997 | Nakamura et al. | |
| 5,885,354 A | 3/1999 | Frosien et al. | |
| 5,916,424 A | 6/1999 | Libby et al. | |
| 6,188,068 B1 * | 2/2001 | Shaapur et al. | ............... 850/8 |
| 6,303,932 B1 | 10/2001 | Hamamura et al. | |
| 6,417,512 B1 * | 7/2002 | Suzuki | ..................... 250/307 |

(Continued)

FOREIGN PATENT DOCUMENTS

JP 354124879 9/1979

OTHER PUBLICATIONS

Menozzi, Claudia, et al., "Focused ion beam-nanomachined probes for improved electric force microscopy," Ultramicroscopy, Oct. 2005, pp. 220-225, vol. 104, No. 3-4.

*Primary Examiner*—Jack I Berman
*Assistant Examiner*—Nicole Ippolito Rausch
(74) *Attorney, Agent, or Firm*—Scheinberg & Griner, LLP; Michael O. Scheinberg; David Griner (57) ABSTRACT

A coating is applied to a work piece in a charged particle beam system without directing the beam to work piece. The coating is applied by sputtering, either within the charged particle beam vacuum chamber or outside the charged particle beam vacuum chamber. In one embodiment, the sputtering is performed by directing the charged particle beam to a sputter material source, such as a needle from a gas injection system. Material is sputtered from the sputter material source onto the work piece to form, for example, a protective or conductive coating, without requiring the beam to be directed to the work piece, thereby reducing or eliminating damage to the work piece.

19 Claims, 3 Drawing Sheets

U.S. PATENT DOCUMENTS

| | | |
|---|---|---|
| 6,753,538 B2 | 6/2004 | Musil et al. |
| 6,758,900 B1 | 7/2004 | Matsui |
| 6,926,935 B2 | 8/2005 | Arjavac et al. |
| 6,949,756 B2 | 9/2005 | Gerlach et al. |
| 7,326,445 B2 | 2/2008 | Kaito |
| 7,601,246 B2 * | 10/2009 | Kim et al. .............. 204/192.23 |
| 2002/0134938 A1 * | 9/2002 | Chang et al. ................. 250/311 |
| 2004/0089821 A1 * | 5/2004 | Shichi et al. ........... 250/492.21 |
| 2004/0158409 A1 | 8/2004 | Teshima et al. |
| 2004/0226814 A1 | 11/2004 | Stewart et al. |
| 2004/0251412 A1 | 12/2004 | Tappel |
| 2006/0261270 A1 | 11/2006 | Burkhardt et al. |

* cited by examiner

SPUTTERING COATING OF PROTECTIVE LAYER FOR CHARGED PARTICLE BEAM PROCESSING

This application claims priority from U.S. Provisional Patent Application No. 60/773,396, filed Feb. 15, 2006, which is hereby incorporated by reference.

TECHNICAL FIELD OF THE INVENTION

The present invention relates to charged particle beam systems and, in particular, to applying a sputter coating to a work piece.

BACKGROUND OF THE INVENTION

Integrated circuits and other microscopic or nano-scale devices are often processed using charged particle beams for imaging or altering a work piece. For example, focused or shaped ion beams can be directed toward a work piece to micromachine it or to deposit material by beam-induced deposition. Electron beams can similarly be used to etch, deposit, or form images of the work piece using scanning or transmission electron microscopy.

In one application, an ion beam is used to mill a work piece to expose buried features of a work piece to view or modify the buried feature. For example, layers of an integrated circuit may be milled away to expose a buried conductor, which may then be severed or connected to another conductor by ion beam deposition of a new conductive pathway. Ion beams are also used to expose a cross section of a work piece so that the cross section can be viewed using charged particle beam microscopy. A cross section exposed by an ion beam can then be observed using scanning ion microscopy or electron microscopy. For example, U.S. Pat. Pub. No. 20040158409 of Teshima et al. for a "Defect Analyzer" describes methods of cutting cross sections using a focused ion beam. In one technique, referred to as "slice and view," a cross section is exposed by focused ion beam machining and an image is formed of the cross section. Additional material is then removed from the cross section wall to expose a new wall face offset slightly from the first wall face, and an additional image is formed. By sequentially removing a small amount of material from the cross section wall and forming a series of images, information about a three dimensional structure is obtained. Ion beam machining can be facilitated by using an etch-enhancing gas, such as chlorine, fluorine, or iodine, as described in U.S. Pat. No. 5,188,705 for "Method of Semiconductor Manufacture" to Swanson et al.

Ions beams are also used to extract samples from a substrate for viewing in a transmission electron microscope, as described, for example, in U.S. Pat. Pub. 2004/0251412 of Tappel for "Method and Apparatus for Manipulating a Microscopic Sample." A sample is freed from the substrate by milling around the sample and undercutting the sample. The sample is typically attached to a probe and moved to a TEM sample holder. The sample also may be thinned or shaped by the ion beam.

The impact of the ions or electrons in a charged particle beam can damage sensitive work pieces. It is a common practice, therefore, to apply a protective layer over the surface of the work piece before performing charged particle beam processing.

Also, non-conductive work pieces tend to accumulate electric charges during charged particle beam processing, both from the charges delivered by the beam and from the ejection of secondary charges caused by the impact of the beam. When a work piece becomes charged, it deflects the charged particles in the primary beam, thereby reducing resolution. Work piece charging can also reduce the number of secondary particles emitted upon impact of the charged particle beam. Because the secondary particles are often used to form images of the work piece, the reduction in the emission of secondary charges degrades the ability of the system to form an image of the work piece. One method of reducing sample charging, described in U.S. Pat. No. 4,639,301 to Doherty for "Ion Beam Processing," involves the use of an electron flood gun to neutralize accumulated positive charges. Another method of preventing the accumulation of charge is by depositing a conductive layer onto the surface of the work piece to provide a path through which the electrical charge can be discharged.

One method of depositing a protective coating, whether conductive or non-conductive, is by charged-particle-beam-induced deposition. In charged-particle-beam-induced deposition, a charged particle beam is scanned over the work piece surface while a precursor gas is introduced in the vicinity of the beam impact area. The precursor gas molecules are chemically decomposed in the presence of the beam to leave a coating on the surface. Volatile decomposition products float away from the surface and are removed by the system vacuum pump. For example, in ion-beam-assisted gas deposition of a conductive coating, a charged particle beam of between about 5 kV and 30 kV is scanned over the surface while a precursor gas, such as a metaloorganic gas, for example, tungsten hexacarbonyl, is directed to the substrate in the vicinity of the beam landing area. Either an ion beam or an electron beam can be used to decompose the precursor gas to deposit a coating, but electron beams cause less surface damage because electrons have significantly less mass than ions. Although electron beams cause less surface damage than ion beams, the electron beams can still damage some sensitive materials, such as the photoresist or low-k or ultra low-k dielectric layers that are used in integrated circuit fabrication. The beam-induced damage can cause changes in the dimensions being measured on the work piece and changes in the profile being observed.

Another method of covering a surface with a layer of a material is sputtering. Sputtering, also known as physical vapor deposition, is a physical, as opposed to chemical, process in which molecules or atoms are knocked from a material source by momentum transfer and are then deposited onto a target surface. Sputter coating systems are available commercially and are used in integrated circuit fabrication. Such systems are typically designed to deposit a metal layer over an entire wafer. The metal layer is then patterned using a photolithography process to form a conductive pattern to connect elements of the circuit. Such systems typically use a plasma of ionized argon gas, the argon ions colliding with a target to knock material from the target onto the work piece. Such systems typically use electric fields to provide energy to ionize the gas, and may use magnetic fields to trap electrons to facilitate ionization. The use of these production systems to sputter coat samples for quality control or defect analysis may be prohibitively expensive. Other systems, such as the Gatan Ion Sputter Coater can provide a sputter coating on small samples, but will not accommodate a typical semiconductor wafer, and so the wafer must be broken. In either case, coating requires moving the work piece between the sputter system and the charged particle beam system, which can entail multiple evacuations of vacuum chambers, potential contamination as the work piece is moved between system, and additional time and manpower.

SUMMARY OF THE INVENTION

An object of the invention is to provide a coating onto a work piece surface for charged particle beam processing while eliminating or minimizing damage to the surface.

The invention includes a method and apparatus for providing a sputter coating on a surface to protect the work piece for charged particle beam processing.

In one embodiment, the system includes a source material within a charged particle beam system. A charged particle beam is directed toward a source material to sputter the material from the source material onto the work piece surface. The charged particle beam does not need to be directed to the work piece, so damage from the impact of the charged particles onto a sensitive work piece surface can be avoided.

In other embodiments, the sputtering may be performed using a conventional sputtering apparatus, either within a separate chamber or within the same vacuum chamber as the charged particle beam system. After the sputter coating is applied, the work piece is processed with a charged particle beam.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

The invention provides for the sputter application of a protective or conductive layer or coating for charged particle beam processing. Charged particle beam processing can include, for example, micromachining or imaging by an ion beam or by an electron beam.

For many applications of charged particle beam processing, it is desirable to protect the surface of the work piece before performing the charged particle beam operation. Charged particle beam deposition typically requires the charged particles in the beam to impact the surface, which can damage the surface. Embodiments of the invention can be used to apply a sputter coat to protect the work piece surface materials, and can also be used to provide a conductive material over an area to reduce charge to achieve better resolution and charge control of the work piece. Sputtering provides for charged particle beam coating without the charged particles landing on the sample, thereby preventing or minimizing damage to the work piece from the charged particle beam.

Figure 1:
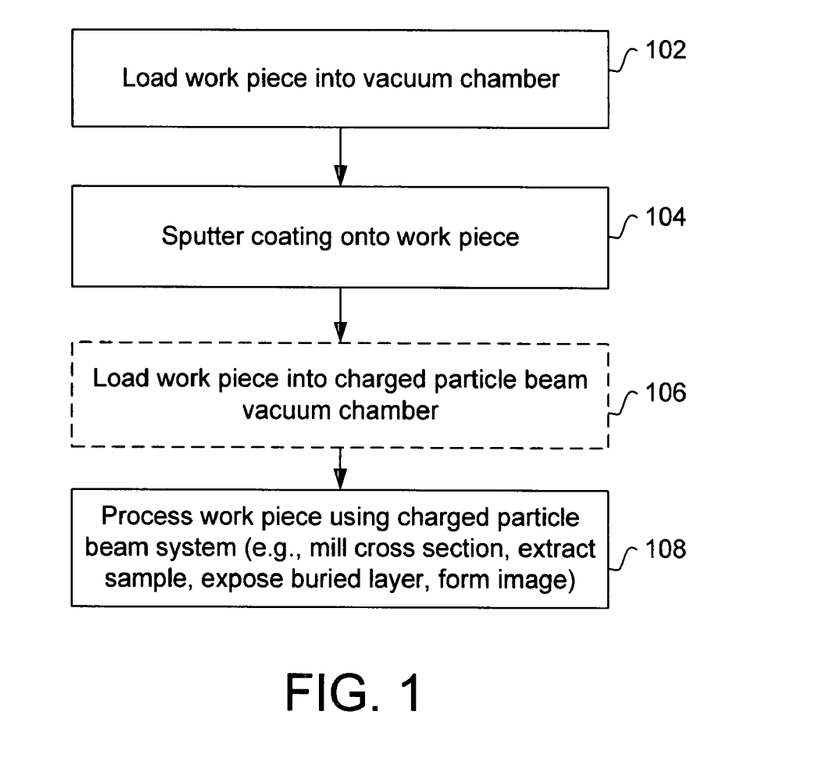
FIG. 1 is a flow chart showing a preferred embodiment of the invention.

FIG. 1 shows a preferred embodiment of the invention. In step 102, the work piece is loaded into a vacuum chamber for sputtering. In step 104, a protective or conductive coating is sputtered onto the work piece. The coating can cover the entire work piece surface, or just a portion of the surface. In optional step 106, the work piece is moved to a charged particle beam system vacuum chamber. Step 106 is optional, because in some embodiments, the sputtering and the charged particle beam processing occur in the same vacuum chamber. For example, the sputtering may be performed by the charged particle beam, or by a sputtering system that uses a plasma to knock material from a sputter material source within the charged particle beam vacuum chamber. In step 108, the work piece, having a sputtered coating, is processed using a charged particle beam. For example, a cross section may be milled in the work piece, and then imaged, or a sample may be extracted from the work piece using the charged particle beam.

Some embodiments of the invention provide for in-situ sputter work piece coating for sample protection and local area charge control. By in-situ is meant that the coating can be applied in the sample vacuum chamber as the charged particle beam system, so the work piece does not need to be moved between systems for coating and charged particle beam processing. Such embodiments can be used with currently available charged particle system with little or no system modifications, and do not require an additional plasma-type sputtering system. These embodiments provide a broad capability and can be implemented in many different ways depending on the requirements of any specific application.

In-situ embodiments of the system can provide a new capability for both fab-based and lab-based systems for little or no extra cost depending on the material one wants to sputter onto the work piece. In-situ embodiments allow for controlled local sputter coating on a localized portion of a work piece surface. Almost any material that can be sputter coated using conventional sputtering techniques can also be sputtered using embodiments of the invention. Sputter coatings can be applied onto any work piece in the charged particle beam vacuum chamber. Sputter coating is often a preferred method for sample protection when working with materials such as low k dielectrics, including ultra-low k dielectrics, and photoresists. Embodiments can be used to apply a sputter coating to protect the work piece surface materials, and can also be used to provide a conductive material over an area to reduce charge to achieve better resolution and charge control of the sample.

In accordance with an in-situ embodiment, a sputter material source is provided between the ion beam source and the work piece. The charged particle beam is directed toward the sputter source material, and material is sputtered from the sputter source material onto the work piece. The source material can comprise, for example, tungsten, chromium, titanium, copper, aluminum, or any other metallic or non-metallic material having a suitable vapor pressure that allows operation of the charged particle beam system.

Figure 2:
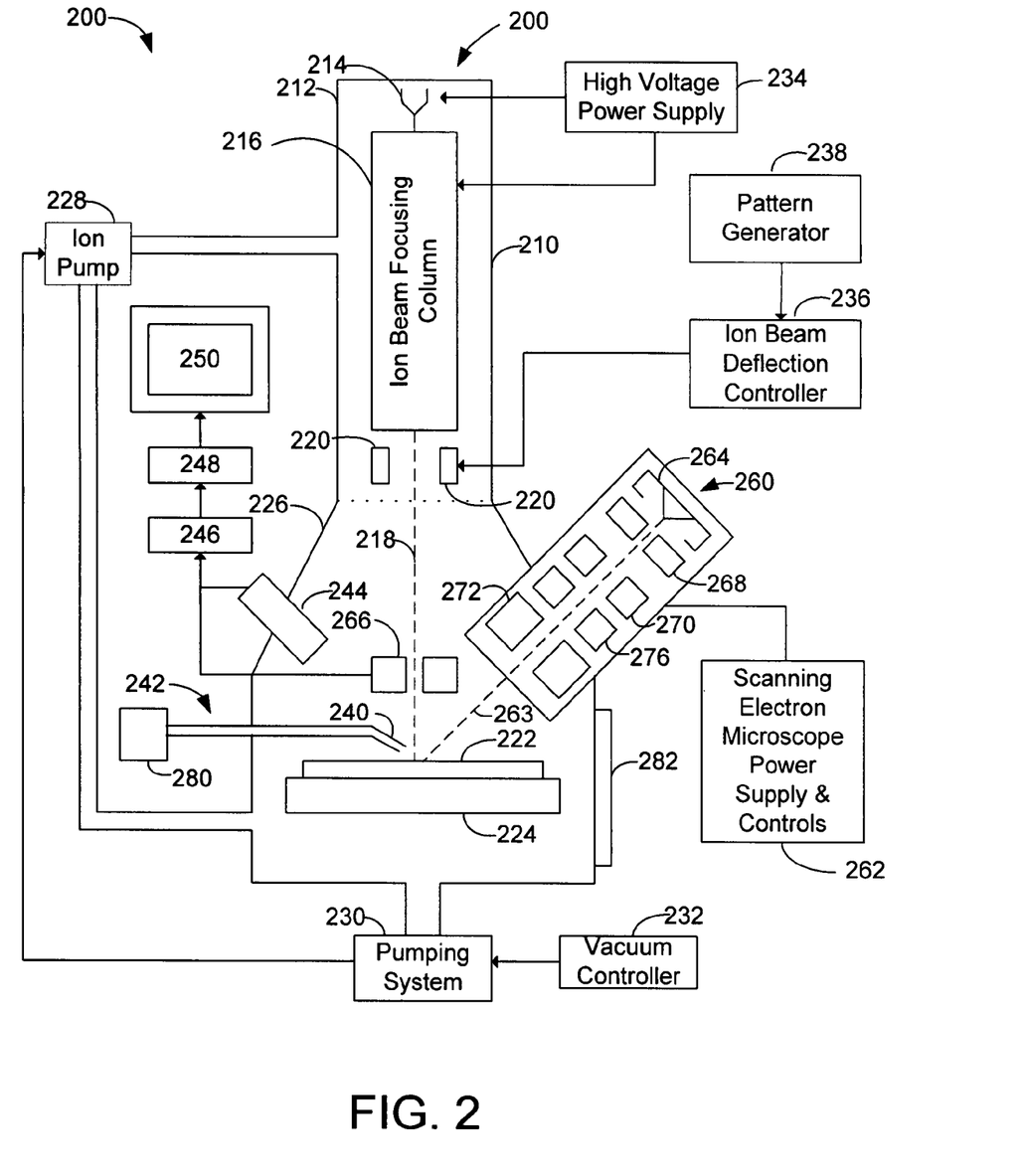
FIG. 2 shows a dual beam system in which the present invention can be implemented.

FIG. 2 shows a typical dual beam FIB/SEM system 200 that can be used to implement an embodiment of the invention. Dual beam systems are available commercially from FEI Company, the assignee of the present invention. Focused ion beam system 200 includes an evacuated envelope 210 having an upper neck portion 212 within which are located an ion source 214 and an ion beam focusing column 216 including extractor electrodes and an electrostatic optical system (not shown). Ion beam 218 passes from ion source 214 through ion beam focusing column 216 and between electrostatic deflectors schematically indicated at 220 toward work piece 222, which comprises, for example, a semiconductor device positioned on movable X-Y stage 224 within lower chamber 226. An ion pump 228 is employed for evacuating neck portion 212. The chamber 226 is evacuated with turbo-molecular and mechanical pumping system 230 under the control of vacuum controller 232. The vacuum system provides within chamber 226 a vacuum of between approximately $10^{-7}$ Torr ($10^{-7}$ mbar) and $5 \times 10^{-4}$ Torr ($1.7 \times 10^{-4}$ mbar). If an etch assisting gas, an etch retarding gas, or a deposition precursor gas is used, the chamber background pressure may rise, typically to about $10^{-5}$ Torr ($10^{-5}$ mbar).

High voltage power supply 234 is connected to ion source 214 as well as to appropriate electrodes in ion beam focusing column 216 for forming an ion beam 218 and directing the same toward work piece 222. Deflection controller and amplifier 236, operated in accordance with a prescribed pattern provided by pattern generator 238, is coupled to deflection plates 220 whereby ion beam 218 may be controlled to trace out a corresponding pattern on the upper surface of work piece 222, or, in accordance with the invention, on a sputter material source such as a nozzle 240 of a gas injection system 242 described below. Because of its small diameter, nozzle 240 is also referred to sometimes as a needle. In some systems the deflection plates 220 are placed before the final lens, as is well known in the art.

The ion source 214 typically provides a metal ion beam of gallium, although other ion sources, such as a multicusp or other plasma ion source, can be used, using for example, oxygen, argon or another noble gas for ions. The ion source 214 typically is capable of being focused into a sub one-tenth micron wide beam at work piece 222 for either modifying the work piece 222 by ion milling, chemically-enhanced etch, material deposition, or for the purpose of imaging the work piece 222. Rather than focusing the beam to a point, the ion column may also provide a shaped beam. Shaped beams can provide larger currents to reduce sputtering time. A secondary electron detector 244, such as a charged particle multiplier used for detecting secondary ion or electron emission for imaging is connected to amplifier 246. The amplified signals are converted into digital signals and subjected to signal processing by the signal processor unit 248. The resulting digital signal is to display an image of work piece 222 on the monitor 250.

A scanning electron microscope 260, along with a power supply and control unit 262, is also provided with the FIB system 200. An electron beam 263 is emitted from a cathode 264 by applying voltage between cathode 264 and an anode 268. Electron beam 263 is focused to a fine spot by means of a condensing lens 270 and an objective lens 272. Electron beam 263 is scanned two-dimensionally on the specimen by means of a deflection coil 276. Operation of condensing lens 270, objective lens 272, and deflection coil 276 is controlled by power supply and control unit 262. Some embodiments include a detector for detecting electrons that are transmitted through a thin work piece, for use in a scanning transmission electron microscopy mode. While the presence of an electron beam and an ion beam is useful for most applications, the invention is not limited to a dual beam system.

Electron beam 263 can be focused onto work piece 222, which is on movable X-Y stage 224 within lower chamber 226. When the electrons in the electron beam strike work piece 222, secondary electrons are emitted. These secondary electrons are detected by secondary electron detector 244 or by backscattered electron detector 266, which are connected to an amplifier 246. The amplified signals are converted into digital signals and subjected to signal processing by the signal processor unit 248. The resulting digital signal is to display an image of work piece 222 on the monitor 250.

Gas injection system 242 extends into lower chamber 226 for introducing and directing a gaseous vapor toward work piece 222. U.S. Pat. No. 5,851,413 to Casella et al. for "Gas Delivery Systems for Particle Beam Processing," assigned to the assignee of the present invention, describes a suitable gas injection system 242. Another gas delivery system is described in U.S. Pat. No. 5,435,850 to Rasmussen for a "Gas Injection System," also assigned to the assignee of the present invention. The gas injection system includes nozzle 240, typically made of chromium. As describe below, nozzles made of various material, coated with various materials, or having affixed thereto, volumes of different material, can be used to provide a variety of materials to sputter onto work piece 222. Nozzle 240 can be moved into the path of ion beam 218 so that ions in the beam sputter material from nozzle 240 onto the work piece 222. Nozzle 240 can then be moved out of the beam path to allow processing of work piece 222 by the beam. One or more electric motors 280 are used to move the nozzle along one or more axes.

A door 282 is opened for inserting work piece 222 onto stage 224, which may be heated or cooled, and also for servicing an internal gas supply reservoir, if one is used. The door 282 is interlocked so that it cannot be opened if the system is under vacuum. The high voltage power supply provides an appropriate acceleration voltage to electrodes in ion beam focusing column 216 for energizing and focusing ion beam 218. A "load lock" can be used so to avoid having to evacuate the entire sample area to load or unload a work piece.

As describe above, in some embodiments, the source material for the sputtering is in the form of the needle of a gas injection system (GIS). Because focused ion beam systems often include one or more of GIS systems, the invention can be readily implemented in existing systems. The GIS system is typically secured to the vacuum chamber wall, and is mounted on a positioned adjustment mechanism that allows the nozzle to be moved to direct the gas to the desired location, or to be withdrawn from the vicinity of the sample when not in use. For a charged particle beam system that includes multiple GIS systems, the GIS nozzles of different GIS systems can be made of different materials, so that sputter coatings of different materials can be applied by using different ones of the GIS nozzles as the sputtering material source. The GIS nozzles can be made from the desired sputter source material, or can be coated with the sputter source material. Alternatively, one or more volumes of source material can be attached to one or more the GIS nozzles, for example, by using FIB deposition, brazing, welding, or by using an adhesive.

Figure 3:
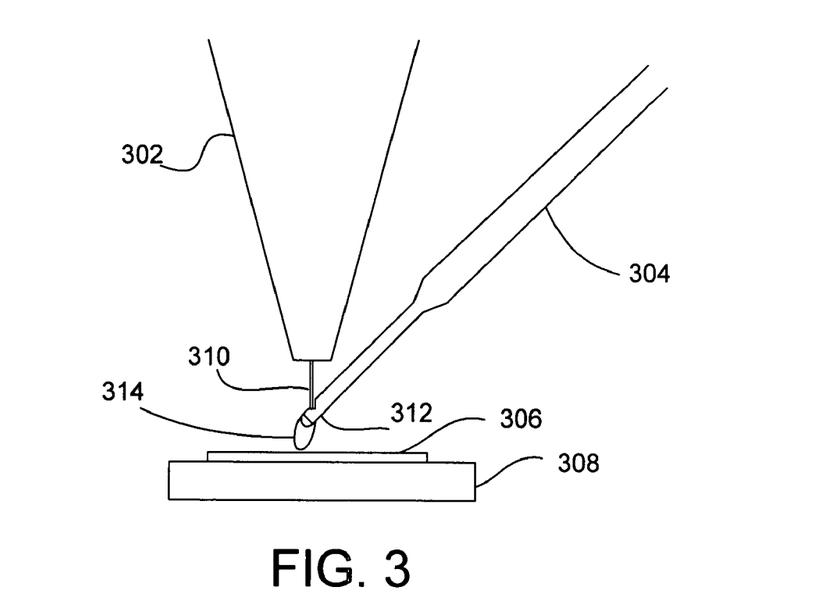
FIG. 3 shows a charged particle beam sputtering material onto a work piece.

FIG. 3 shows an embodiment of the invention. An ion column 302 provides an ion beam 310 that is directed to a sputter material source, such as GIS nozzle 304. A work piece 306 is supported on a work piece stage 308 having at least an x-y translation capability. The ion beam 310 sputters atoms 314 or molecules from GIS nozzle 304, atoms 314 being ejected toward the surface of work piece 306. The ion beam typically has a diameter (full width, half maximum) upon impact of less than 10 μm, more preferably less than, 1 μm, and typically less than 0.5 μm While it is convenient to use the GIS nozzle as the sputter material source because many charged particle beam systems already include a GIS, in-situ embodiments are not limited to using a GIS needle. For example, some charged particle beam systems include a micromanipulator for manipulating small items within the vacuum chamber. Micromanipulator systems typically include a probe for attaching to a sample or other item in the vacuum chamber. The probe, or a material attached to the probe could be used as the sputter material source. Alternative, the sputter material source could be on or part of any device introduced into the vacuum chamber that has the ability to be positioned to sputter onto the work piece and to be withdrawn to allow the charged particle beam to process the work process.

Figure 4:
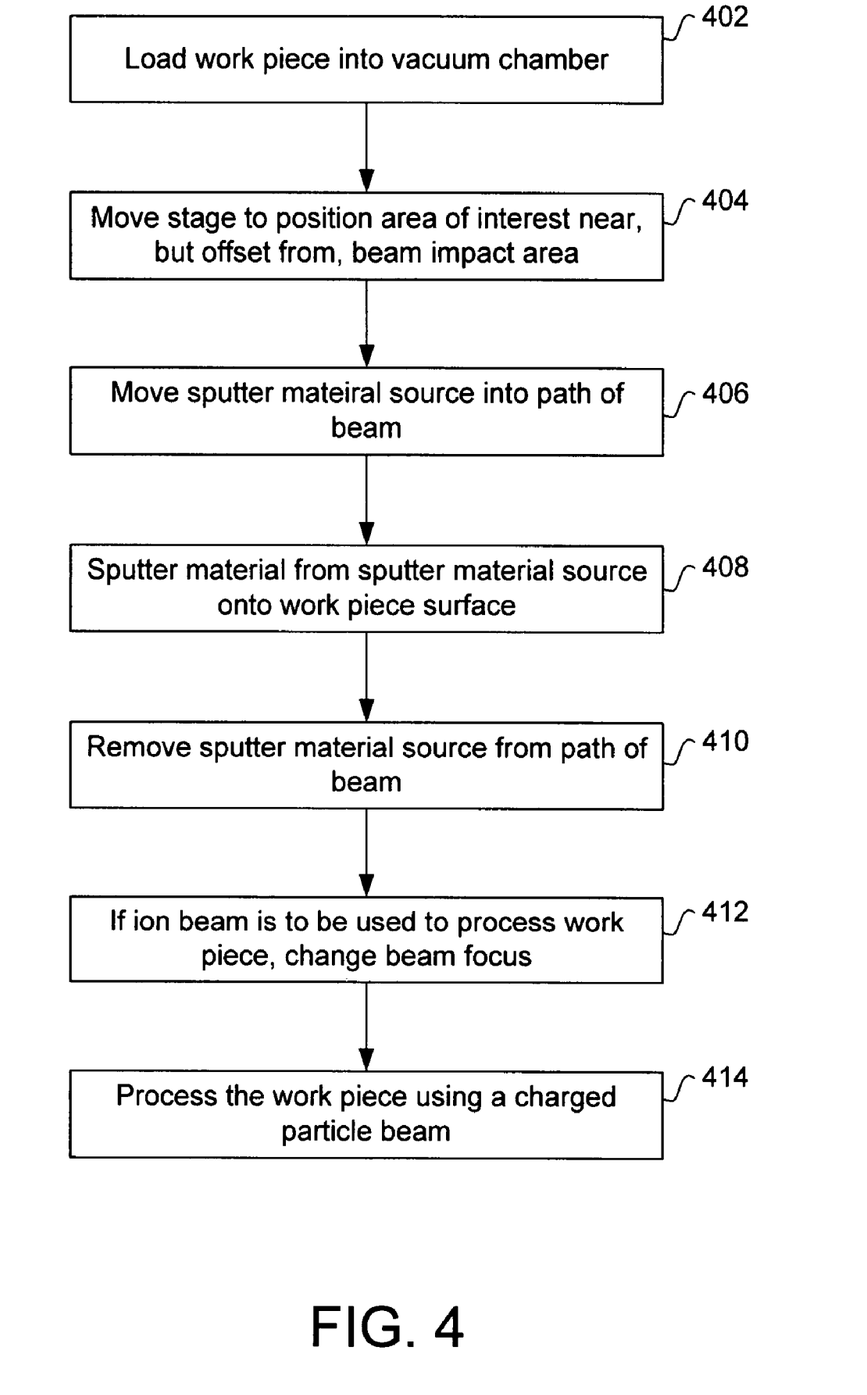
FIG. 4 is a flow chart showing the preferred steps for an embodiment of the invention.

FIG. 4 is a flow chart showing the steps for a preferred in-situ embodiment of the invention using a GIS needle as the sputter material source. In step 402, the work piece is loaded into the vacuum chamber. In step 404, the stage is moved to position the area of the work piece to be coated near, but slightly offset from, the impact point of the beam. In step 406, a sputter material source, such as a GIS nozzle, is moved into the ion beam path. Skilled persons will be able to determine empirically the optimum position of the area to be coated relative to GIS needle and the charged particle beam. In step 408, the ion beam is directed to the sputter material source and material is sputtered from the source onto the work piece surface. If required, the stage can be moved during the sputtering process to coat a larger area. The position of the coating on the work piece can be adjusted by adjusting the position of beam impact on the GIS nozzle, the position of the stage, or the position of the GIS nozzle. After the coating is applied to the work piece, the sputter material source is removed from the beam path in step 410. In step 412, the ion beam is re-focused onto the work piece if the ion beam is to be used to process the work piece, and in step 414, the work piece is processed by the ion beam or by the electron beam.

Some embodiments can use multiple GIS needles. For example, one GIS could dispense gas for beam-assisted gas deposition and one could be used as a source of material for sputtering, or a single needle can be used for both functions sequentially or at the same time. Sputtered particles may be useful for decomposing a precursor to deposit material, in addition to the deposition of the sputtered material itself. The multiple needles could be made or coated with different materials so that sputtered layers of different materials could be applied without removing the work piece from the vacuum chamber. For example, one needle could be coated with one material and a second needle could be made from a different material, or a small target of material could be attached to the needle(s) to allow a selection of various sputter target materials with the use of a single or multiple GISs. Needles could be partially coated, or coated in layers, for example, with later-applied coatings leaving portions of the earlier coatings exposed, so that one could sputter from the underlying material or from one or more of the coatings to provide different materials for coating. Sequential processes can be used, in which multiple coatings are applied; some using sputtering deposition and some using beam-induced gas deposition. The orientation or position of the sputter material source can be varied for precise targeting of the sputtering onto the features of interest on the work piece. That is, the area coated can be controlled by "sputter steering," for example, by changing the position or orientation of the sputter source, as well as the beam parameters, the distance from the sputter source to the work piece, and other parameters.

Various embodiments can be used for relatively small, selected area coverage, or for large area coverage. Multiple materials are available for sputtering, including but not limited to, chromium, titanium, tungsten, copper, and aluminum.

In one embodiment, chromium from a GIS needle was deposited on a sputtered area on the order of 10,000 square microns using an ion beam having a landing energy of 30 keV, with a beam current of 20 nA. Larger beam currents result in faster sputter deposition. Larger coverage areas can be achieved, for example, by moving the sample using an X-Y translation stage or by increasing the distance between the sputter source and the work piece. The beam current can be adjusted to speed up or slow down deposition and to control the deposition regions. Beam currents as low as 100 pA or 300 pA may be suitable for coating small areas. The time required to produce a protective coating will vary with the size of the area coated and the thickness of the coat.

Sputtering for thirty minutes has been shown to produce a significant amount of deposition. Coating thicknesses from a 30 minute process were estimated to be greater than 150 nm, so coatings in the 10 s of nanometers are easily achievable in less time. It is expected that much shorter sputter times, on the order of five to ten minutes or less, will produce a coat of adequate thickness over a typical area of interest.

The ion beam is typically rastered on the GIS needle or other sputter material source in a rectangular pattern. A typical raster size is 40 µm by 5 µm. A relatively large raster size is preferred to avoid removing too much material from the GIS needle in one position. A typically GIS needle has a tip diameter of about 1.5 mm. The beam focus is changed from the work piece to the needle for sputtering, and then the focus can be changed back to the work piece for further processing.

The amount of material sputtered is typically relatively small compared to the thickness of the GIS needle, so in most embodiments, wear of the GIS needle is not a problem. The raster can be moved to different positions on the GIS to reduce wear.

In most embodiments, the sample position and the GIS position are fixed, while the beam rasters on the GIS needle. The landing position of the primary beam on the sputter material source can be varied to adjust the position of the sputter coating and to coat a larger area. Of course, any or all of the sample, the GIS needle, or the beam can be moved to increase the size or adjust other parameters of the sputter coating on the work piece.

The invention provides for producing a coating on the work piece in a charged particle beam system without requiring that the beam be directed toward the work piece. There may be incidental impact of the charged particle beam onto the work piece while the beam is directed to the sputter source, without departing from the scope of the invention. Any incidental impact may be out of focus and can cause less damage than directing a focused or shaped particle beam toward the work piece. The invention can be applied to any work piece, including integrated circuits, thin film read/write heads, microelectromechanical assemblies (MEMS) and other devices. Unlike a prior art plasma sputter system, some embodiments of the present invention use charged particle beam optics, such as an objective lens and optionally a condenser lens, to converge the beam before sputtering. Unlike prior art wafer sputtering systems that produce a coating over an entire wafer, some embodiments of the invention provide the capability for coating a relatively small portion of a wafer or other work piece, thereby allowing other die on a wafer to be unaffected. In one embodiment, a circle of about 200 µm diameter was coated. The size of the coated area varies with the size of the pattern milled by the ion beam on the sputter material source. Smaller areas, such as within the 20 µm to 50 µm meter range should be readily achievable.

Besides the in-situ embodiments described above, some embodiments sputter without using a particle beam. For example, material may be sputtered using a diode, triode, or magnetron-type sputtering system. Such systems provide a protective layer onto a work piece surface, without directing a charged particle beam toward the surface, thereby reducing or eliminating damage to the surface. After the protective coating is applied, the work piece can be processed using the charged particle beam, for example, to form an image, to extract a sample, or to expose a cross section or buried layer. The sputtering mechanism can be located in a vacuum chamber different from the one in which the sample is processed using a charged particle beam, or the sputtering mechanism can be located within the same vacuum chamber, so that the work piece does not need to be transported between machines.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method for forming a coating on a work piece in a vacuum chamber of a charged particle beam system having a particle beam source and a work piece support, comprising:
   inserting a work piece into the vacuum chamber of the charged particle beam system and onto the work piece support;
   providing in the vacuum chamber a sputter material source, the sputter material source being positioned between the particle beam source and the work piece;
   directing a focused or shaped charged particle beam toward the sputter material source so that the charged particle beam impacts the surface of the sputter material source to sputter material from the sputter material source onto an area of the work piece to form a layer of material on the area of work piece, thereby avoiding damage to the work piece; and
   directing the charged particle beam toward the area of the work piece to process or form an image of the work piece.

2. The method of claim 1 in which directing a focused or shaped charged particle beam toward the sputter material source and directing the charged particle beam toward the area of work piece to process form an image of the work piece occur in the same vacuum chamber, without the work piece being removed from the vacuum chamber between the steps of directing the charged particle beam towards the sputter source and directing the charged particle toward the area of work piece, thereby allowing a protective or conductive layer to be applied and a work piece with the protective or conductive layer to be processed or imaged without removing the work piece from the vacuum chamber.

3. The method of claim 1 in which directing a focused or shaped charged particle beam toward an area of the work piece to process an area the work piece includes directing an electron beam toward the work piece to form an image of the area of the work piece using secondary or transmitted electrons.

4. The method of claim 1 in which directing a focused or shaped charged particle beam toward an area of the work piece to process an area of the work piece includes directing a focused ion beam toward the area of work piece to micromachine the work piece or to deposit material onto the work piece.

5. The method of claim 1 in which directing a focused or shaped charged particle beam toward the sputter material source so that the charged particle beam impacts the surface of the sputter material source includes directing a focused or shaped charged particle beam toward a gas injection system nozzle or material coated or material supported on a gas injection nozzle so that the charged particle beam impacts the surface of the gas injection system nozzle or material coated or material supported on a gas injection nozzle.

6. The method of claim 1 in which directing the charged particle beam toward the sputter material source includes directing the charged particle beam toward a source of material to form a protective or conductive layer on the work piece.

7. The method of claim 1 in which directing a focused or shaped charged particle beam toward the sputter material source includes directing the charged particle beam toward the sputter material source to sputter tungsten, chromium, titanium, copper, or aluminum material from the sputter material source onto the work piece.

8. The method of claim 1 in which directing a focused or shaped charged particle beam toward the sputter material source so that the charged particle beam impacts the surface of the sputter material source to sputter material from the sputter material source onto an area of the work piece to form a layer on the area of work piece includes directing a focused or shaped charged particle beam toward the sputter material source so that the charged particle beam impacts the surface of the sputter material source to sputter material from the sputter material source onto a portion of a wafer or other work piece smaller than the entire surface of the wafer or other work piece.

9. A charged particle system including a memory storing computer instructions to perform the steps of claim 1.

10. A method of charged particle beam processing, comprising:
    placing a work piece in the vacuum chamber of the charged particle beam system;
    sputtering a coating onto a work piece using a focused or shaped charged particle beam;
    then, without removing the work piece from the vacuum chamber, processing the work piece using the charged particle beam to etch material from the work piece, deposit material onto the work piece, or to form an image of the work piece, the sputter coating protecting features on the work piece surface during charged particle beam processing.

11. The method of claim 10 in which sputtering a coating onto a work piece includes sputtering a coating onto a portion of a wafer or other work piece smaller than the entire surface of the wafer or other work piece.

12. The method of claim 10 in which sputtering a coating onto a work piece includes directing an ion beam to a sputter material source to sputter material from the source onto the work piece.

13. The method of claim 10 in which processing the work piece using the charged particle beam includes directing the charged particle beam toward the work piece to alter the shape of the work piece.

14. The method of claim 13 which directing the charged particle beam toward the work piece to alter the shape of the work piece includes milling the work piece to expose a cross section.

15. The method of claim 13 in which directing the charged particle beam toward the work piece to alter the shape of the work piece includes milling the work piece to extract a sample from the work piece.

16. The method of claim 14 in further comprising directing an electron beam toward the exposed cross section to form an image of the cross section using scanning electron microscopy and in which the work piece remains in the same vacuum chamber for sputtering, for processing by the focused or shaped charged particle beam, and for directing the electron beam.

17. The method of claim 10 in which sputtering a coating onto a work piece includes using a plasma to sputter material from the source onto the work piece.

18. A charged particle system including a memory storing computer instructions to perform the step of claim 10.

19. A charged particle beam system, comprising:
 a charged particle source;
 charged particle beam optical components for forming the charged particles into a focused or shaped beam for processing a work piece positioned within a vacuum chamber;
 multiple sputter material sources for sputtering different materials, the multiple sputtering material sources positioned within a vacuum chamber;
 a manipulator for moving the sputter material sources into a first position between the charged particle beam source and the work piece in which the charged particle beam can be directed to the sputter material source to sputter material from the sputter material source onto the work piece to form a coating on the work piece without directing the charged particle beam toward the work piece and to a second position in which the sputter material source is not in the beam path to allow the charged particle beam can be directed to impact the work piece;
 a memory storing computer instructions to perform the steps of:
 directing the charged particle beam toward the sputter material source so that the charged particle beam impacts the surface of the sputter material source to sputter material from the sputter material source onto an area of the work piece to form a protective layer on the area of work piece, thereby avoiding damage to the work piece; and
 directing the charged particle beam toward the area of the work piece to process or form an image of the work piece after the protective layer has be formed.

* * * * *